United States Patent [19]

Popall et al.

[11] Patent Number: 5,668,237
[45] Date of Patent: Sep. 16, 1997

[54] SILICON AND ZIRCONIUM BASED LACQUER, ITS USE AS A SUBSTRATE COATING AND SUBSTRATES THUS OBTAINED

[75] Inventors: Michael Popall, Wurzburg; Jochen Schulz; Birke Olsowski, both of Veitshochheim; Monika Pilz, Kleinrinderfeld, all of Germany

[73] Assignees: E.I. DuPont de Nemours and Company, Del.; Fraunhofer-Gesellschaft Zur Forderung Der Angewandten Forschung, Munich, Germany

[21] Appl. No.: 347,472
[22] PCT Filed: Jun. 5, 1993
[86] PCT No.: PCT/EP93/01427
§ 371 Date: Feb. 15, 1995
§ 102(e) Date: Feb. 15, 1995
[87] PCT Pub. No.: WO93/25605
PCT Pub. Date: Dec. 23, 1993

[30] Foreign Application Priority Data

Jun. 10, 1992 [FR] France .................. 92 07007

[51] Int. Cl.⁶ .................................................. C08G 79/00
[52] U.S. Cl. .................. 528/9; 528/10; 528/32; 528/43; 528/395
[58] Field of Search ................... 528/9, 10, 32, 528/43, 395

[56] References Cited

U.S. PATENT DOCUMENTS

| | | |
|---|---|---|
| 4,238,590 | 12/1980 | Scholze et al. .................. 528/9 |
| 4,374,933 | 2/1983 | Scholze et al. .................. 528/10 |
| 4,746,366 | 5/1988 | Philipp et al. .................. 106/287 |
| 5,401,528 | 3/1995 | Schmidt .................. 427/2.26 |

FOREIGN PATENT DOCUMENTS

| | | |
|---|---|---|
| 0078548 | 5/1983 | European Pat. Off. . |
| 0171493 | 2/1986 | European Pat. Off. .......... C09D 3/82 |
| 0171493 | 5/1987 | European Pat. Off. . |
| 3925901 | 11/1990 | Germany . |
| 3925902 | 11/1990 | Germany .................. B05D 7/26 |
| WO92/16183 | 10/1992 | WIPO . |

OTHER PUBLICATIONS

English translation of JP-A-343407/1992.

Primary Examiner—Melvyn I. Marquis
Attorney, Agent, or Firm—Morgan & Finnegan, LLP

[57] ABSTRACT

The present invention relates to a lacquer obtained by the process comprising the steps of: (i) precondensation of: a) 1 to 10 mol % of at least one zirconium compound of the formula $ZrR_4$; b) 20 to 94 mol % of at least one organic silane of the formula $R'''_m(R'''Y)_nSiX_{(4-m-n)}$; c) 5 to 30 mol % of at least one organic silane of the formula $R''_pSiX_{4-p}$; d) optionally 0 to 10 mol % of at least one low-volatility metal oxide; and (ii) hydrolysis condensation of the precondensate of step (i) in the presence of 0 to 50% of the stoichiometric amount of water. The invention also relates to a process for the obtention of a coating on substrate which comprises the steps of applying the lacquer and curing same. The invention also relates to the thus-coated substrates.

55 Claims, 1 Drawing Sheet

SILICON AND ZIRCONIUM BASED LACQUER, ITS USE AS A SUBSTRATE COATING AND SUBSTRATES THUS OBTAINED

The present invention relates to a novel silicon and zirconium based lacquer, its use as a substrate coating and the thus-obtained substrates.

Hitherto, studies and efforts have been made to obtain lacquers endowed with improved technical properties, to be used as coating for substrates which are typically used in extremely harsh environments. Examples of coatings which allow the coated substrates to be used in said harsh environments are coatings with properties such as: anti-contamination, anti-scratch, heat-resistance and refractory properties, low moisture permeability, resistance to chemicals, insulation properties, oxygen-barrier, high bulk resistivity, low friction coefficient, high adhesion to the substrates and the like.

The fields wherein said coatings may be used are varied and numerous. One can cite, as illustrative, those fields wherein the coatings provide protection for active and passive electrical, electronic, optical components and assemblies thereof against environmental stresses.

During the past years, research in the field of microelectronics has been directed to higher productivity and devices miniaturisation. Thus, the use of surface-mounted devices (SMD), rendering high-speed component placement possible, has lead to significant gain in productivity, the soldering of such surface mounted devices (SMD) on the printed circuits now being carried out on the face(s) of the circuit where the devices are lodged. The two soldering processes currently used are wave soldering and reflow soldering. The first of these two processes, the so-called wave soldering process, comprises the step of bringing the printed circuit bearing the SMDs adhered thereon into contact with a stationary wave formed in a bath of molten solder, the parameters of temperature and time being respectively about 260° C. and about 10 s for conventional tin/lead solder, given that the operating conditions vary as a function of the solder employed. The second process, so-called fellow soldering, comprises the step of applying solder in the solid state at the contact pins of the SMD adhered on the printed circuit board followed by heating, using IR radiation or vapor phase transfer, of the foregoing assembly at a temperature of about 220° C. for a period of time of about 30 secs. The component and the substrate are thus submitted to somewhat drastic thermal conditions, but they must of course retain their properties, especially electronic properties, i.e. the shift due to the thermal treatment should be less than a few percent, typically less than 3%.

Concurrently, efforts have been directed to miniaturise the components themselves and new components such as new capacitors, have been developed. These new capacitors known as thin-film capacitors are obtained by laminating thin layers of metal, e.g. aluminium, and thin layers of a bulk dielectric material, the electrode pins of this SMD being obtained by deposition of metal, e.g. aluminium. Good and promising results have been obtained with such capacitors, obtained from films made of polyester e.g. polyethylene terephtalate (PET) or polyethylene naphtalate (PEN) and which have been metallized. An example of a manufacturing process for said new capacitors is the process known as Interleaf®. Processes for preparing thin-film capacitors are for example described in the following U.S. Pat. Nos.: 4,741,876, 4,744,462, 4,533,813, 4,535,381, 4,531,268, 4,534,488, and 4,531,340.

However, these new components, such as the above thin-film capacitors, suffer from certain drawbacks. One is that polyester foils are known to absorb water. This water will cause corrosion and erosion of aluminium electrodes (the metal foils), and also a capacitance shift which occurs due to moisture content changes, meaning that during the above-mentioned soldering processes the rapid evaporation of water will tend to cause delamination.

These problems connected with water are cumulated with the low melting-point of the polyester. Therefore, the use of thin film capacitors as microelectronic SMDs which can withstand the soldering processes requires encapsulation of these thin films. The encapsulating casing has to be endowed with insulation properties in order to protect the SMD. But now the benefit gained thanks to the miniaturisation of the capacitors is lost, due to the bulkiness of the insulating casing.

An alternative has thus been proposed in order to avoid the use of said insulating casing. It is based on the coating of the component SMD e.g. the capacitor, with a material which acts as a barrier and thus prevent degradation of the SMD. But the properties required are multiple. Major properties, among others, are, in the case of the above-mentioned SMD such as a thin film capacitor: efficiency at low thickness, high adhesion on the substrate such as aluminium and polyester, low permeability to moisture, thermal properties sufficient to withstand drastic soldering conditions, electrical properties such as high surface and bulk resistance and high breakdown voltage, chemical properties like solvents and soaps resistance, easy application on the substrates, absence of harmfulness to the environment and the like. Various materials have been provided, such as polyvinyl chloride (PVC), high density polyethylene (HDPE) and the like, as a coating for SMDs and others, but the results thus obtained are not satisfying. These materials, known as water barrier materials, are not adherent to the substrate, made from, e.g. polyester, silicon, ceramic, metal, and the like and are not able to withstand high temperatures.

Similar and other problems arise with a wide variety of SMDs, as well as with optical devices, printed circuit boards, and the like. Examples of substrates contemplated within the scope of the present invention are, by way of illustration: resistors, integrated circuits, optical waveguides and switches, multichip modules (MCMs), Si-wafers, printed circuit boards (PCBs) such as PCBs based on FR-4 laminates or $Al_2O_3$-ceramic boards with Cu- and Au-conductor lines, and hybrid circuits.

Also, enhanced integration, faster signal transmission, similarly to the reduced size of SMD, requires new patternable materials. The potential of new generations of RAM and ROM chips, especially processors, cannot be fully used without enhanced integration and multilayer technology. Therefore microelectronics requires tailormade materials and new techniques for interconnection. Multilayer technology demands patternable dielectric materials with specific properties, such as: high breakdown voltage, low permittivity constant, high bulk resistance, high corrosion resistance, high adhesion to various types of substrates, and the like. Such materials, endowed with the afore-mentioned properties, applied as a coating and further processed, would open up new developments for very large system integration techniques (VLSI).

The foregoing examples show a need for a variety of coatings endowed with improved properties. But, a unique coating for use as a coating in nearly all cases would be most advantageous. This would allow, for example, one-step processing of the PCBs with all SMDs arranged thereon.

Attempts have been made to attain such a coating with numerous properties, but the results obtained so far are not promising.

EP-A-0171493 describes a lacquer which is scratch-resistant. This lacquer is obtained by polymerizing: a) a zirconium compound, $ZrR_4$, b) a silane of the formula $R'_m(R''Y)_nSiX_{(4-m-n)}$ wherein Y is a polymerizable group, and c) a low-volatility oxide. There is no mention of the specific lacquer according to the present invention, neither of the use thereof as a coating for electronic or optical devices.

EP-A-0078548 describes a polycondensate for use as lens material, especially for contact lenses. This polycondensate is obtained by polymerizing: a) a zirconium compound, $ZrR_4$, b) a silane of the formula $R'_m(R''Y)_nSiX_{(4-m-n)}$ wherein Y is a polymerizable group, c) a silane of the formula $R_p''SiX_{4-p}$ and d) a low-volatility oxide. There is no mention of the specific lacquer according to the present invention, neither of the use thereof as a coating for electronic or optical devices.

The aim of the invention is to provide said "universal" coating, thanks to the application of a novel lacquer.

Figure 1:
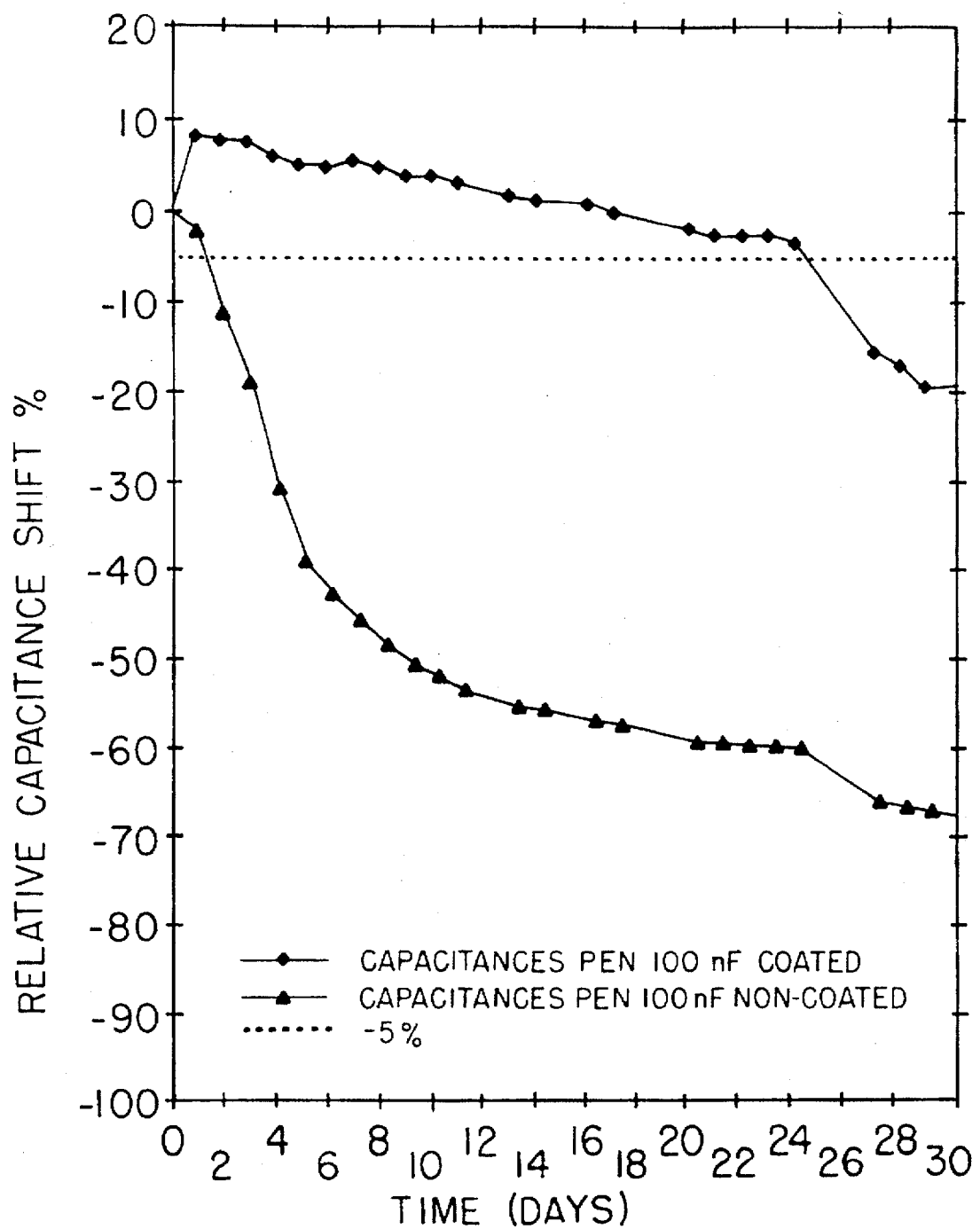
FIG. 1 shows the relative capacitance shifts on coated and uncoated 2 μm thin-film PEN-capacitors (100 nf) in a 90° C., 100% RH life test.

Thus, the present invention provides a lacquer obtained by the process comprising the steps of carrying out:

(i) precondensation of:
a) 1 to 10 mol % of at least one zirconium compound of formula I:

$$ZrR_4 \qquad (I)$$

wherein:
R is halogen, hydroxy, alkoxy, acyloxy, or chelated ligand;

b) 20 to 94 mol % of at least one organic silane of the formula II:

$$R''_m(R'''Y)_nSiX_{(4-m-n)} \qquad (II)$$

wherein
R" is alkyl, alkenyl, aryl, alkylaryl, arylalkyl, alkenylaryl, arylalkenyl,
R''' is alkylene, alkenylene, arylene, alkylarylene, arylalkylene, alkenylarylene, arylalkenylene, R" and R''' being optionally interrupted by oxygen, sulfur, or —NH—,
X is hydrogen, halogen, hydroxy, alkoxy, acyloxy, $-NR_2'$ where R' is H or alkyl,
Y is a polymerizable group,
m and n are integers from 0 to 3;
where m+n is from 1 to 3; and c) 5 to 30 mol % of at least one organic silane of the formula III:

$$R_p''SiX_{4-p} \qquad (III)$$

wherein R" and X have the above meaning, and p is 1, 2 or 3; and optionally d) 0 to 10 mol % of at least one low-volatility metal oxide, soluble in the reaction medium, of an element of main groups Ia to Va or sub-groups IVb or Vb, or a compound of one of these elements, soluble in the reaction medium, forming a low-volatility oxide;

preferably in the absence of water, optionally in the presence of an organic solvent at a temperature comprised between 10° and 80° C. for a period of time comprised between 0.5 and 72 hours; and (ii) condensation of the precondensate of step (i) without water or with up to 50% of the stoichiometric amount of water, at a temperature comprised between 20° and 90 ° C. for a period of time comprised between 0.5 and 72 hours.

Preferably, component a) of formula I represents from 2 to 6 mol%, the component b) of formula II represents 69 to 83 mol%, the component c) of formula III represents 15 to 25 mol%, and the component d) is absent.

In the above formulae I, II and III, the groups R, R', R", X or Y which may be present several times in one or more compound(s), may have the same meaning or different meanings. Thus, for example, the group X in formulae II and III may be methoxy in both formulae or methoxy in formula II and hydroxy in formula III. Also, the group R in formula I may have from four distinct meanings to one unique meaning.

The term "alkyl", as used herein, is intended to mean, but is not limited to, saturated, straight, branched or cyclic groups having from 1 to 20, preferably from 1 to 10 carbon atoms, more preferably from 1 to 6; the most preferred groups are lower alkyl groups containing 1 to 4 carbon atoms. Examples of such groups are, by way of illustration: methyl, ethyl, n-propyl, isopropyl, n-butyl, sec-butyl, tert-butyl, isobutyl, n-pentyl, n-hexyl and cyclohexyl.

The term "aryl", as used herein, is intended to mean aromatic groups having from 6 to 25, preferably 6 to 14, and most preferably 6 to 10 carbon atoms. Examples are phenyl and naphthyl; phenyl being the preferred aryl group.

The term "alkenyl", as used herein, is intended to mean mono- or poly-unsaturated, straight, branched or cyclic group having from 2 to 20, preferably 2 to 10, more preferably 2 to 6 carbon atoms. Examples of such groups are: allyl, 2-butenyl and vinyl.

The groups alkylaryl, arylalkyl, alkenylaryl, arylalkenyl, alkylene, alkenylene, arylene, alkylene-arylene, arylene-alkylene, alkenylene-arylene, arylene-alkenylene, alkoxy, acyloxy, alkylamino, dialkylamino, amides, alkylcarbonyles, alkoxycarbonyles and the like are derived from the above mentioned alkyl, aryl and alkenyl groups, according to the nomenclature well-known to the man skilled in the art. Examples of such groups are: methoxy, epoxy, n- and i-propoxy, n-sec- and tert-butoxy, isobutoxy, β-methoxy-ethoxy, acetyloxy, propionyloxy, monomethylamino, monoethylamino, dimethylamino, diethylamino, ethylene, propylene, butylene, phenylene, toluylene, benzyl, styryl, methylcarbonyl, ethylcarbonyl, methoxycarbonyl and ethoxycarbonyl.

The above groups may be substituted by one or more usually employed substituents, such as halogen, lower alkyl, hydroxy, nitro, amino, and the like. The term "halogen" as used herein intends to mean fluorine, chlorine, or bromine, chlorine being preferred.

The zirconium compound a) of the formula I is:

$$ZrR_4 \qquad (I)$$

wherein:
R is halogen, hydroxy, alkoxy, acyloxy or chelated ligand; and is also referred to as the "inorganic network former".

Examples of inorganic network former zirconium compounds are, by way of illustration: $ZrCl_4$, $Zr(O-C_3H_7)_4$, $Zr(O-C_4H_9)_4$, $Zr(acetylacetonato)_2(O-C_3H_7)_4$, Zr(acetylacetonato)$_4$, Zr compounds with chelated ligands, preferably coordinated by oxygen or nitrogen. The preferred group is Zr(O—isoC$_3$H$_7$)$_4$, i.e. tetraisopropoxy zirconate, referred to hereinafter as Zr in the formulae for the lacquer.

The silane b) of the formula II is:

   (II)

wherein:

R" is alkyl, alkenyl, aryl, alkylaryl, arylalkyl, alkenylaryl, arylalkenyl, preferably methyl;

R''' is alkylene, alkenylene, arylene, alkyl-arylene, aryl-alkylene, alkenyl-arylene, aryl-alkenylene, preferably C$_{1-4}$ alkylene R" and R''' being optionally interrupted by oxygen, sulfur, or —NH—, X is hydrogen, halogen, hydroxy, alkoxy, acyloxy, —NR$_2$' where R' is H or alkyl, preferably C$_{1-4}$ alkoxy Y is a polymerizable group, preferably methacryloxy, acryloxy, epoxy, vinyl, allyl;

m and n are integers from 0 to 3, preferably 0 and 1 respectively;

m+n is from 1 to 3;

and is also referred to as the "organic network former". The bridging group R''' may optionally be interrupted by heteroatoms, such as oxygen, sulfur, and nitrogen, as —NH—. Thus, 2 to 10 recurring units, such as polyethers, can be advantageously obtained.

Examples of a functional organic network former are:

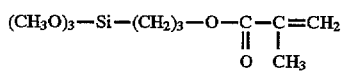

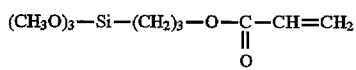

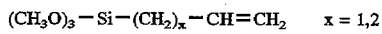

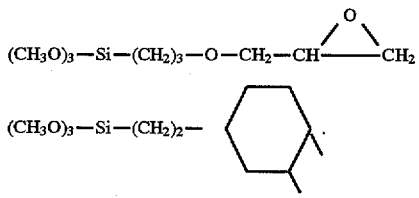

Preferably, component b) of formula II is (R'''Y)SiX$_3$, wherein R''' is a C$_{1-4}$ alkylene, Y is acryloxy, methacryloxy, glycidyloxy, vinyl, allyl, epoxycyclohexyl, and X is C$_{1-4}$ alkoxy.

Most preferred groups are:
3-glycidyloxypropyltrimethoxysilane and 3-methacryloxypropyl-trimethoxysilane, respectively abbreviated as glymo (G) and memo (M) hereinafter.

The silane c) of the formula III is:

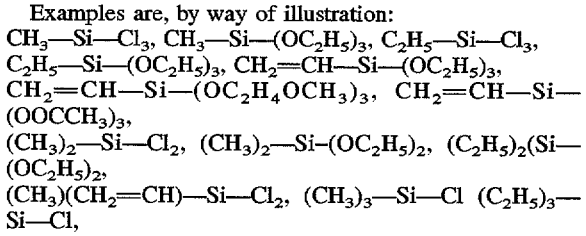

wherein R", X and p have the above meaning, and is also referred to as the "network modifier".

Examples are, by way of illustration:
CH$_3$—Si—Cl$_3$, CH$_3$—Si—(OC$_2$H$_5$)$_3$, C$_2$H$_5$—Si—Cl$_3$, C$_2$H$_5$—Si—(OC$_2$H$_5$)$_3$, CH$_2$=CH—Si—(OC$_2$H$_5$)$_3$, CH$_2$=CH—Si—(OC$_2$H$_4$OCH$_3$)$_3$, CH$_2$=CH—Si—(OOCCH$_3$)$_3$,
(CH$_3$)$_2$—Si—Cl$_2$, (CH$_3$)$_2$—Si—(OC$_2$H$_5$)$_2$, (C$_2$H$_5$)$_2$(Si—(OC$_2$H$_5$)$_2$,
(CH$_3$)(CH$_2$=CH)—Si—Cl$_2$, (CH$_3$)$_3$—Si—Cl (C$_2$H$_5$)$_3$—Si—Cl,
(t—C$_4$H$_9$)(CH$_3$)$_2$—Si—Cl, (CH$_3$)$_2$(CH$_2$=CH—CH$_2$)—Si—Cl,
(CH$_3$)$_2$—Si(OCH$_3$)$_2$, (CH$_3$)$_2$—Si—(OCH$_3$)$_2$, (C$_6$H$_5$)$_2$—Si—Cl$_2$,
(C$_6$H$_5$)$_2$—Si—(OC$_2$H$_5$)$_2$, CH$_2$=CH—Si—Cl$_3$, CH$_2$=CH—CH$_2$—Si—(OC$_2$H$_5$)$_3$,
CH$_2$=CH—CH$_2$—Si—(CH$_3$COO)$_3$, (i—C$_3$H$_7$)$_3$—Si—OH and
(C$_6$H$_5$)$_2$—Si—(OH)$_2$.

Preferably, p is 2; R" is aryl and X is hydroxy or C$_{1-4}$ alkoxy. The most preferred network modifier is (C$_6$H$_5$)$_2$—Si—(OH)$_2$, diphenylsilanediol, hereinafter abbreviated as P2.

The silanes and the zirconium compounds are either commercially available, or are readily prepared according to methods well-known by people skilled in the art; see for example W. Noll "Chemie und Technologie der Silicone", Verlag Chemie GmbH, Weinheim, Bergstrasse (1968). Care should be taken that the silanes and the zirconates are pure; trace amounts of electrolytes such as Cl, B, Ca, Ti, and the like adversely affect the reaction conditions and the properties of the thus-obtained lacquer.

In lieu of the monomers (a), (b) or (c), their respective oligomers may also be used. These oligomers are soluble in the reaction medium and they are partial precondensates. These partial precondensates, or linear or cyclic polyorganosiloxanes -polyorganozirconates- have a low molecular weight, the condensation rate ranging from 2 to 100.

As the optional component (d), one can use low-volatility oxides, soluble in the reaction medium of an element of main groups Ia to Va or sub-groups IVb or Vb of the Periodic Table, or alternatively one compound of one of these elements, soluble in the reaction medium, forming a low volatility oxide as previously described under the reaction conditions. Preferably, component (d) is obtained starting from one of the following elements: Na, K, Mg, Ca, B, Al, Sn, Pb, P, As, Sb and/or V; more preferred are Na, K, Ca, Mg, B, Al, Sn, As and P.

Among the low-volatility oxides, the preferred oxides are Na$_2$O, K$_2$O, CaO, SnO$_2$, As$_2$O$_3$, P$_2$O$_5$, B$_2$O$_3$. B$_2$O$_3$ is most preferred.

The compounds soluble in the reaction medium and forming the above-mentioned low-volatility oxides are numerous. Mineral acids are suitable, such as phosphonic acid, boric acid, as well as their esters, halogenides and salts. Also suitable are the hydroxides such as NaOH, KOH or Ca(OH)$_2$, halogenides such as SnCl$_4$ and PCl$_5$, and alcoholates such as NaOR, KOR, Ca(OR)$_2$ or Al(OR)$_3$, the group R being derived from a lower alcohol such as methanol, ethanol, propanol and butanol. Starting compounds which may optionally be used are the corresponding salts with volatile acids, such as acetates, basic acetates, basic lead acetate and formiate.

In order to achieve the condensation leading to the heteropolycondensate forming the lacquer, the starting components a), b), c) and optionally d), according to the desired amounts and ratios are firstly subjected to a precondensation step. This step is carried out preferably in absence of water, optionally in the presence of an organic solvent, which may be inert under the reaction conditions. This organic solvent is, for example, an alcohol, such as methanol, ethanol, propanol, butanol, an ether, such as dimethoxyethane, an ester such as dimethylglycolacetate, or a ketone such as acetone or methylethylketone. Preferably, the precondensation step is carried out without any external organic solvent. This step is preferably carried out without external addition of water, the water which is present in the reaction medium is resulting from the condensation reaction of the OH-groups of diphenylsilanediol (component c), and also of the

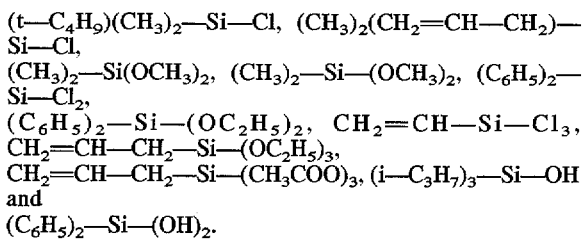

OH-groups with alkoxy-groups. This water may start subsequent condensation of the other components, but to a minor extent.

The precondensation may be carried out in the presence of a catalyst, for example compounds generating proton $H^+$ or hydroxyl ions $OH^-$ as well as amines. Examples of $H^+$-generating compounds are organic or mineral acids, such as hydrochloric acid, sulfuric acid, phosphoric acid, acetic acid and formic acid. Example of $OH^-$-generating compounds and of amines are amonia, hydroxides of alkaline or alkaline-earth metal, e.g. sodium, potassium and calcium hydroxide, and amines which are soluble in the reaction medium, e.g. lower alkylamines and lower alkanolamines. Preferred catalysts are formic acid and ammonia. The total amount of catalyst may range up to 3 mol/l, for example.

The precondensation step is usually carried out at a temperature ranging from 10° to 80° C., preferably from 15° to 50° C. The period of time needed for completion of the precondensation step is comprised between 0,5 and 72 h, preferably between 1 and 48 h. When solvents are used, the same ranges usually apply, including the boiling temperature of the solvent. However, the reaction is preferably carried out at room temperature. The solvent may be removed from the precondensation medium at the end of the reaction.

Optionally, the precondensation may be carried out by first precondensation of one or more of the starting components, or of part of one, several or all starting components, and by subsequently adding the remaining component(s) or part thereof and thus finally carrying out the process of precondensation, or alternatively the process of the further condensation.

The precondensation is carried out up to a degree of advancement such that the precondensate still shows a liquid consistency.

The subsequent condensation (ii) of the precondensate, optionally as a solution free of solvent, is carried out in in the presence of 0 to 50% of the stoichiometric amount of water. The stoichiometry, used in the present specification, is calculated based on the starting materials initially used. Preferably, the amount of water is comprised between 0 and 25% of the stoichiometric amount. According to a preferred embodiment of the present invention, the hydrolysis of the hydrolysable groups takes place in an anhydrous medium, i.e. the condensation is carried out without added water.

Condensation step (ii) may be carried out in the presence of a catalyst, of the type of the one mentioned hereinabove. Preferred catalysts for the condensation (ii) are formic acid and ammonia. The total amount of catalyst may range up to 5 mol/l, for example. During said condensation, one of the previously mentioned organic solvent may be present, either at the beginning of said condensation (ii) if not removed at the completion of the precondensation (i), or it may be added during said condensation. If a solvent is used during the condensation step it may be removed using vacuum.

The condensation (ii) is carried out at a temperature comprised between 20° and 90° C., preferably between 25° and 70° C., and for a period of time comprised between 0.5 and 72 hours, preferably between 2 and 48 h. The reaction parameters, particularly the reaction time, are adjusted as a function of the nature of the starting materials, the reaction conditions of the precondensation, the temperature of the condensation, and the desired viscosity of the lacquer to be obtained. Typically, the condensation is continued so as to obtain the desired inherent viscosity for the lacquer. Preferably, said inherent viscosity is comprised between 5 and 1000 mm²/s. This viscosity is chosen so as to allow the lacquer to be easily processed, i.e. to be easily applied to the subject substrate. The viscosity is measured according to known methods, such as capillary viscosimetry.

The lacquer may be used as such for the coating, or it may contain additional additives. These additives are usual, and include but are not limited to: organic diluents, antisagging adjuvant, pigments, dyes, UV-stabilisant, viscosity-regulator, anti-oxidant, fillers. Preferably, the lacquer contains fillers, such as: clay, calcinated clay, Aerosil®, α-calcite, glass fibers, glass flakes, talc, and the like. The filler may represent from 1 to 70 weight %, based on the weight of the lacquer. Preferred fillers are Luzenac talc and glass fibers/flakes, which may be incorporated in the lacquer prior to coating or sprinkled thereon once coated.

There is no specific requirement as to when the lacquer has to be processed, since the time limit is about 15 years after completion of the condensation reaction; preferably it is applied within 200 days after the end of the condensation. This requirement is due to the variation of viscosity. Alternatively, the lacquer may be obtained step-wise, i.e. by carrying out the precondensation and the condensation at two different times; in this case, care should be taken to store the precondensate in a water-free environment and at a low temperature so that the condensation reaction cannot start.

According to another embodiment, the lacquer can be stored free of solvent, the solvent being removed by, e.g., distillation. If necessary, a solvent and/or a reactive diluent can be added before application to adjust the viscosity. The solvent is the usual solvent (e.g. propanol, butoxyethanol, propoxyacetate). The reactive diluent is, e.g., styrene oxide, phenyl glycidyl ether, neopentylglycol diglycidyl ether, and is incorporated with advantage into the organic network during the curing process.

Another object of the present invention is a process for the obtention of a coating on a substrate which comprises the steps of applying a lacquer according to the present invention on said substrate and curing said lacquer.

The lacquer is applied according to known methods. Examples of said usual methods for applying a lacquer are: brushing, printing, screen-printing, dip-coating followed by spinning-off, soaking, spraying and the like. The method for applying the lacquer is determined based on the viscosity of the lacquer and the substrate to be coated, or alternatively the viscosity of the lacquer may be adjusted in order to be processed in the specific process used in the plant. Also, the component may not need to be coated on all its sides: for example, a cubic substrate which needs to be coated on two sides only can be coated on these sides only using the method which is best suited; this is the case for SMDs such as thin-film capacitors which present two main oxidisable faces. The lacquer thus applied is then cured in order to gain its remarkable properties.

The step subsequent to the condensation is the curing of the condensate of step (ii). This curing is the polymerization of the polymerizable group Y of the organic network former b). This polymerization may be a radical photopolymerization, a thermal and/or hardener polymerization.

The curing may be initiated either by thermal treatment and/or by hardeners, i.e. curing agents. The hardeners may be used along with catalysts. Suitable hardeners are those commonly used, for examples organic peroxides such as diacyl peroxides, e.g. benzoyl and lauroyl peroxide; ketone peroxides e.g. acetone and cyclohexanone peroxides; hydrocarbon peroxides, e.g. tert-butyl, cumyl, decahydronaphthyl peroxides; dihydrocarbyl peroxides e.g. di-tert-butyl and dicumyl peroxides; percetals e.g. 1,1-di-tert-butylperoxy-3, 3,5-trimethylcyclohexane; peresters e.g. tertbutylperbenzoate, tert-butylperoxyisopropyl-percarbonate, bis(4-tert-butylcyclohexyl) peroxydicarbonate, butyl and cyclohexyl percarbonate, bicyclohexyl peroxydicarbonate, tert-butyl perpivalate, tert-butyl peroctoate and tert-butyl permaleate; as well as acetylcyclohexane sulfonyl peroxide. Usual azoic initiators, such as azobisisobutyronitrile, and conventional primary and secondary aliphatic or aromatic amines, e.g. diethylenetriamine, are suitable as well. The boron trifluoride monoethylamine complex may also be used as hardener. Anhydrides, such as hexahydrophthalic acid anhydride, are also appropriate; in the case of hexahydrophthalic acid anhydride, N-benzyldimethylamine is advantageously used as catalyst. Halogenated antimony, e.b. $SbF_6$, may also be used. The type of hardeners depends upon the functionality to be polymerised. If the functionality is a double bond C=C, the hardener is usually a peroxy compound. If the functionality is an epoxy, the hardener is an amine, $SbF_6$, hexahydrophthalic acid anhydride/N-benzyldimethylamine, or boron trifluoride monoethylamine complex. For the curing of epoxy, preferred hardeners are anhydride/amine and boron trifluoride. The amount of hardener may range widely; in case of epoxy curing it may range from 1 to 100%, based on the epoxy content, preferably from 5 to 50%. When catalysts are used along with hardeners, they may represent from 0.01 to 100 wt % preferably 5%, based on the weight of hardener.

The thermal curing, with or without hardener, is carried out at a temperature comprised 20° and 200° C., preferably 50° and 150° C. The curing time may vary widely; usually it is comprised between 10 mn and 72 hours, preferably between 0.5 and 20 hours. The thermal curing may be carried out under vacuum, optionally.

The photocuring may be an IR-curing, an UV-curing, or any suitable photocuring, e.g. a curing acting under actinic radiation, and the like. Preferably, the photocuring is a UV-curing. In this latter case, initiators UV-activated are suitable. Examples of said initiators are: 1-hydroxy-cyclohexylphenylketone, benzyldimethylcetal, 2-hydroxy-2-methyl-1-propanone, butyl oxide, benzoine oxide, ethyl oxide, benzophenone, benzoine, substituted thioxanthones and ionic photoinitiators like triarylsulfoniumhexafluorophosphate and -antimonate salts (e.g. Cyracure UVI 6974 from Union Carbide). A preferred UV-initiator is 1-hydroxy-cyclohexylphenylketone, for the curing of (meth)acryloxy functionalities of the group Y of component b). The 1-hydroxy-cyclohexyl-phenylketone is commercially available under the tradename IRGACURE 184 (Ciba-Geigy company).

The amount of thermal or UV-curing initiator is comprised between 0.01 to 5 wt %, based on the weight of the lacquer; it may also be calculated based on the content of polymerizable groups, as state hereinabove. Accelerators may also be added to the foregoing. Examples of such accelerators are tertiary amines, preferably N-methyldiethanolamine. The amount of said accelerator is comprised between 10 and 300 wt %, preferably 50 and 200 wt %, based on the weight of the photoinitiator.

According to an embodiment of the present invention, the curing is alternately thermal and a UV-curing. Different sequences have been found to be efficient. Examples are given below, wherein p means photocuring with Irgacur under UV radiations; and t means thermal curing at 120° C. with anhydride/amine or boron trifluoride. The number between parentheses after t and p stands for the curing time, expressed in hours and minutes, respectively. These examples are given by way of illustration of combining t and p-curing: p(1)-t(16); t(16)-p(1); t(1)-p(1)-t(16); and the like.

According to another embodiment, the curing can be a two-step curing, in that sense that a photocuring is first carried out, so as to enable the coated substrate to be handled, and a thermal curing is then carried out to completely cure the lacquer. The first step is quite short, e.g. about 30 seconds, and the coating becomes non-sticky, so that the thus-coated substrate can be easily handled. The lacquer, at this time, is a "precured" lacquer. The second step requires a longer period of time, e.g. 16 hours. Due to the fact, the substrate is non-sticky, there is no requirement of a minimal distance between the substrates places in the oven: there is no risk of sticking together. This embodiment allows easier and faster processing, smaller ovens, and the like.

The coating obtained by the present process has a thickness comprised between 0.1 and 200 µm, preferably between 1 and 150 µm. Before applying the lacquer, the substrate may be coated with a keying agent or with a primary layer or sub-layer, although this pre-coating is not required. The coating may also be obtained as a dual layer, the sub-layer being e.g. a lacquer with a filler and the external layer being a pure lacquer.

Any substrate may be coated with the present lacquer, and particularly substrates such as SMDs and PCBs. The substrate can for example be a thin-film capacitor, multiplechip module, resistor, integrated circuit, Si-wafer, optical component. The present lacquers show a very high adhesion on these various substrates, being adherent to metal, polyester, ceramics, and the like.

Thus, another object of the present invention is to provide substrates having applied thereon a coating obtained by the present process. Also, the present coating process may alternatively be expressed as the use of the present lacquer as a coating.

The present invention is now described in more details in the following examples, which have to be understood as illustrative of the scope of the invention and in no case as limiting said scope, defined in the appended claims.

EXAMPLE 1

Synthesis of GMP2Zr

The preparation of system GMP2Zr is described for a 0.4 mol formulation:

| | | |
|---|---|---|
| 94.45 g | (0.4 mol, 38.6 mol %) | GLYMO (3-glycidyloxypropyl-trimethoxysilane from the company Union Carbide) |
| 99.24 g | (0.4 mol, 38.6 mol %) | MEMO (3-methacryloxypropyl-trimethoxysilane from the company Fluka) |
| 41.97 g | (0.2 mol, 18.92 mol %) | diphenylsilanediol (from the company Fluka) |
| 13.10 g | (0.04 mol, 3.86 mol %) | Zr (tetraisopropoxyzirconate from the company Fluka) |

Into a 500 ml three-necked glass flask equipped with a multiple coil condenser, a thermometer and a drop funnel the monomers are weighed in the sequence given above. The suspension is stirred magnetically and the temperature will decrease by about 1°–2° C. The suspension becomes a viscous paste. After about 30 min, the reaction temperature will increase slightly, but after 5 hours the exothermic hydrolysis reaction starts and leads to a clearing of the mixture. At this time the temperature may rise over 25° C., and the mixture is then cooled down to 20° to 23° C. using a water bath. The reaction mixture needs 13 additionnal hours of stirring at room temperature for a complete conversion.

After storage of two days at 20° C. (climatized chamber) the GMP2T lacquer is fit for application. At that time the inherent viscosity is about 12 mm²/s (determined by an Ubbelohde capillary viscosimeter at 20° C.).

EXAMPLE 2

In 10 g of the GMP2Zr lacquer as prepared above, 1.22 g of hexahydrophthalic acid anhydride (50 mol% based on the epoxy content) and 0.061 g of N-benzyldimethylamine (5 wt % based on the acid anhydride) are added. Thin-film PET capacitors ($C_0$=450 nF) are dipped in this solution. A spin-off process (600 rpm for 40 sec) follows. Curing of the coating is performed by heating at 120° C. for 16 h. The applied coating has a thickness of about 4 µm. Testing of the thus-coated capacitors under humid conditions (90° C., relative humidity RH: 100%) shows a start of decrease in capacitance after 5 days whereas for the uncoated ones the decrease starts after only 1 day. A workable capacitor should withstand the foregoing humid conditions for 3 days before capacitance decrease starts in order to be acceptable as an SMD. The test is performed with two sets of 20 capacitors.

EXAMPLE 3

In 10 g of the GMP2Zr lacquer as prepared above, 1.22 g of hexahydrophthalic acid anhydride (50 mol % based on the epoxy content) and 0.061 g of N-benzyldimethylamine (5 wt % based on the acid anhydride) are added. Thin-film PEN capacitors made of 2 µm thin-films (100 nF) are dipped in this solution. Curing of the coating is performed by heating at 120° C. for 12 h. The applied coating has a thickness of about 5 µm. An accelerated life test at 90° C. and 100% RH is chosen to quickly observe differences between the coated and uncoated components. No voltage is applied. The criterion used for comparison was the time that components withstand these conditions with a net relative capacitance shift of less than 5%. The result is given in FIG. 1. The uncoated chips reach −5% rapidly within 2 days; but for coated chips even after 30 days under test conditions, only 60% of the total electrode area has been eroded.

EXAMPLE 4

Synthesis of GMP2ZrHydr

The preparation of system GMP2ZrHydr is described for a 0.4 mol formulation:

| | | |
|---|---|---|
| 94.45 g | (0.4 mol, 38.6 mol %) | GLYMO (3-glycidyloxypropyl-trimethoxysilane from the company Union Carbide) |
| 99.24 g | (0.4 mol, 38.6 mol %) | MEMO (3-methacryloxypropyl-trimethoxysilane from the company Fluka) |
| 41.97 g | (0.2 mol, 18.92 mol %) | diphenylsilanediol (from the company Fluka) |
| 13.10 g | (0.04 mol, 3.86 mol %) | Zr (tetraisopropoxyzirconate from the company Fluka) |
| 10.65 g | (0.59 mol, 25% stoich) | $H_2O$ |

Into a 500 ml-three-necked glass flask equipped with a multiple coil condenser, a thermometer and a drop funnel the monomers are weighed in the sequence given above. The suspension is stirred magnetically and the temperature decreases by about 1°–2° C. The stirring at room temperature is stopped after 18 h. Then the temperature is brought to about 70° C. within a period of time of about 90 min. The composition becomes clear and the total amount of water is added in a single step. The temperature of the mixture is maintained at about 70° C. When the lacquer becomes clear after the addition of water (about 20–30 min), the composition is stirred for a further hour while being kept heated. After completion of the reaction, the lacquer cools down to room temperature.

PROPERTIES

Some of the properties the new lacquer is endowed with are given below.
Good adhesion to substrate:

The present coating shows good adhesion to various substrates. The adhesion is measured with cross-cut tape test for coatings 10 µm thick according to the method DIN 53151. The scale ranges from 0 to 5; for example, the adhesion on flat glass, Al, stainless steel is comprised within the respectives ranges of: 0.5–1.5; 1.5–2.5 and 0–1. Further, the coating wets PET and PEN, the polyester constituting thin-film capacitors with wetting angles less than 20°.
Thermal stability:

The coating has been applied to Al and heated in steps of 1 hour at 150° C., 180° C., 210° C., 240° C., 270° C. and 300° C. No crack formation or color change appears until up to the highest temperature. A particular immersion for 30 sec in a bath of molten solder at 280° C. does not affect the material properties.
Electrical properties:

The breakdown strength is about 200 V/µm, as measured on nickel; the dielectric constant ($\epsilon$ at 1 kHz) is about 4.
Contaminants:

The present coating has a very low alkali content (as low as 10 ppm). The presence of contaminants being one factor that contributes to electrode erosion and corrosion, the present coatings are less susceptible to corrosion.
Chemicals:

The present coating is resistant to commonly used industrial solvents and detergents.
Behavior towards water:

The water absorption is less than 0.5% and the water vapor permeation rate (WVPR) is about 15 g/m²d, as measured for a 100 µm thick coating. Water is an important factor making for corrosion and the low WVPR of the present coating thus reduces corrosion.
Long shelf-life:

Shelf-lives of more than 200 days are obtainable. This is an advantage compared to conventional epoxy systems which need to be procesed within a short period of time after completion of the reaction.
Viscosity:

Component miniaturisation requires that coatings applied to the chip should be very thin, typically less than 100 µm. Possible application technologies for capacitors include dip-coating (eventually followed by spinning off excess material), screen-printing or coating of the cut-edges by a dip process similar to the one used to apply the conducting paste as electrodes on ceramic chips. Different technologies require different viscosities of the starting material. The viscosity of the present lacquer can easily be adapted to these requirements.

We claim:

1. A process for making a lacquer comprising the steps of:

(i) precondensing:

a) 1 to 10 mol % of at least one zirconium compound of the formula I:

$$ZrR_4 \qquad (I)$$

wherein:

R is halogen, hydroxy, alkoxy, acyloxy or chelated ligand;

b) 20 to 94 mol% of at least one organic silane of the formula II:

$$R''_m(R'''Y)_n SiX_{(4-m-n)} \qquad (II)$$

wherein:

R" is alkyl, alkenyl, aryl, alkylaryl, arylalkyl, alkenylaryl, or arylalkenyl;

R''' is alkylene, alkenylene, arylene, alkylarylene, aryl-alkylene, alkenyl-arylene, or arylalkenylene;

R" and R''' being optionally interrupted by oxygen, sulfur or —NH—;

X is hydrogen, halogen, hydroxy, alkoxy, acyloxy, or —NR'$_2$ where R' is hydrogen or alkyl;

Y is a polymerizable group;

m is an integer from 0 to 3 and n is an integer from 1 to 3; m+n is from 1 to 3; and c) 5 to 30 mol% of at least one organic silane of formula III:

$$R''_p SiX_{4-p} \qquad (III)$$

wherein R" and X are defined in b), and p is 1, 2 or 3; and d) 0 to 10 mol% of at least one low-volatility metal oxide, soluble in the precondensation reaction medium, of an element of groups Ia to Va or IVb or Vb of the Periodic Table of the Elements, or a compound of one of these elements, soluble in the reaction medium, forming a low-volatility oxide; optionally in the presence of an organic solvent at a temperature of between 10 and 80° C. for a period of time ranging from between 0.5 and 72 hours; and ii) condensation the precondensate of step (i) without water or with up to 50% of the stoichiometric amount of water, at a temperature of between 20 and 90° C. for a period of time from between 0.5 and 72 hours.

2. The process according to claim 1 wherein the precondensation of step (i) is carried out in the absence of water.

3. The process according to claim 1 wherein the component a) of formula I represents from 2 to 6 mol%, the component b) of formula II represents 69 to 83 mol%, the component c) of formula III represents 15 to 25 mol%, and the component d) represents 0 mol%.

4. The process according to claim 1 wherein component a) of formula I is Zr(O-isoC$_3$H$_7$)$_4$.

5. The process according to claim 1 wherein at least one component b) of formula II is (R'''Y)SiX$_3$, wherein R''' is a C$_{1-4}$ alkylene, Y is acryloxy, methacryloxy, glycidyloxy, allyl, vinyl, or epoxycyclohexyl, and X is C$_{1-4}$ alkoxy.

6. The process according to claim 1 wherein component b) of formula II is 3-glycidyloxypropyltrimethoxysilane and/or 3-methacryloxypropyltrimethoxysilane.

7. The process according to claim 1 wherein component c) of formula III is R"$_2$SiX$_2$, wherein R" is an aryl and X is hydroxy or C$_{1-4}$ alkoxy.

8. The process according to claim 7 wherein component c) is (C$_6$H$_5$)$_2$Si(OH)$_2$.

9. The process according to claim 1 wherein component a) is Zr(O-isoC$_3$H$_7$)$_4$; component b) is (R'''Y) SiX$_3$, wherein R''' is a C$_{1-4}$ alkylene, Y is acryloxy, methacryloxy, glycidyloxy, allyl, vinyl, or epoxycyclohexyl, and X is C$_{1-4}$ alkoxy; and component c) is R"$_2$SiX$_2$, wherein R" is aryl and X is hydroxy or C$_{1-4}$ alkoxy.

10. The process according to claim 1 wherein the condensation of step (ii) is carried out in the absence of water.

11. The process according to claim 1 wherein the precondensation step (i) is carried out in the absence of external solvent.

12. The process according to claim 1 in which the precondensation of step (i) and/or the condensation of step (ii) is carried out catalytically.

13. The process according to claim 1 wherein the precondensation of step (i) is carried out at a temperature of between 15° and 50° C. and for a period of time ranging from 1 to 48 hours.

14. The process according to claim 1 wherein the condensation of step (ii) is carried out at a temperature of between 25° and 700° C. and for a period of time ranging from between 2 and 48 hours.

15. The process according to claim 1 wherein the lacquer made by the process has an inherent viscosity ranging from between 5 and 1000 mm$^2$/ second.

16. The process according to claim 1 which further comprises step (iii) adding additional additives to the precondensate (i) and/or the condensate (ii).

17. The process according to claim 16 wherein the additional additives are fillers added in an amount ranging from 1 to 70%, based on the weight of the lacquer.

18. A lacquer obtained by a process comprising the steps of:

(i) precondensing:

a) 1 to 10 mol% of at least one zirconium compound of the formula I:

$$ZrR_4 \qquad (I)$$

wherein:

R is halogen, hydroxy, alkoxy, acyloxy or chelated ligand;

b) 20 to 94 mol% of at least one organic silane of the formula II:

$$R''_m(R'''Y)_n SiX_{(4-m-n)} \qquad (II)$$

wherein:

R" is alkyl, alkenyl, aryl, alkylaryl, arylalkyl, alkenylaryl, or arylalkenyl;

R''' is alkylene, alkenylene, arylene, alkylarylene, aryl-alkylene, alkenyl-arylene, or arylalkenylene;

R" and R''' being optionally interrupted by oxygen, sulfur or —NH—;

X is hydrogen, halogen, hydroxy, alkoxy, acyloxy, or —NR'$_2$ where R' is hydrogen or alkyl;

Y is a polymerizable group;

m is an integer from 0 to 3 and n is an integer from 1 to 3; m+n is from 1 to 3; and c) 5 to 30 mol% of at least one organic silane of formula III:

$$R''_p SiX_{4-p} \qquad (III)$$

wherein R" and X are defined in b), and p is 1, 2 or 3; and d) 0 to 10 mol% of at least one low-volatility metal oxide, soluble in the precondensation reaction medium, of an element of groups Ia to Va or IVb or Vb of the Periodic Table of the Elements, or a compound of one of these elements, soluble in the reaction medium, forming a low-volatility oxide; optionally in the presence of an organic solvent at a temperature of between 10° and 80° C. for a period of time ranging from between 0.5 and 72 hours; and ii) condensation the precondensate of step (i) without water or with up to 50% of the stoichiometric amount of water, at a temperature of between 20° and 90° C. for a period of time from between 0.5 and 72 hours.

19. The lacquer according to claim 18 wherein the pre-condensation of step (i) occurs in the absence of water.

20. The lacquer according to claim 18 wherein the component a) of formula I represents from 2 to 6 mol%, the component b) of formula II represents 69 to 83 mol%, the component c) of formula III represents 15 to 25 mol%, and the component d) represents 0 mol%.

21. The lacquer according to claim 18 wherein component a) of formula I is $Zr(O-isoC_3H_7)_4$.

22. The lacquer according to claim 18 wherein at least one component b) of formula II is $(R'''Y)SiX_3$, wherein R''' is a $C_{1-4}$ alkylene, Y is acryloxy, methacryloxy, glycidyloxy, allyl, vinyl, or epoxycyclohexyl, and X is $C_{1-4}$ alkoxy.

23. The lacquer according to claim 18 wherein component b) of formula II is 3-glycidyloxypropyltrimethoxysilane and/or 3-methacryloxypropyltrimethoxysilane.

24. The lacquer according to claim 18 wherein component c) of formula III is $R''_2SiX_2$, wherein R'' is aryl and X is hydroxy or $C_{1-4}$ alkoxy.

25. The lacquer according to claim 24 wherein component c) is $(C_6H_5)_2Si(OH)_2$.

26. The lacquer according to claim 18 wherein component a) is $Zr(O-isoC_3H_7)_4$; component b) is $(R'''Y)SiX_3$, wherein R''' is a $C_{1-4}$ alkylene, Y is acryloxy, methacryloxy, glycidyloxy, allyl, vinyl, epoxycyclohexyl, and X is $C_{1-4}$ alkoxy; and component c) is $R''_2SiX_2$, wherein R'' is aryl and X is hydroxy or $C_{1-4}$ alkoxy.

27. The lacquer according to claim 18 wherein the condensation of step (ii) is carried out in the absence of water.

28. The lacquer according to claim 18 wherein the pre-condensation step (i) is carried out in the absence of external solvent.

29. The lacquer according to claim 18 in which the precondensation of step (i) and/or the condensation of step (ii) is carried out catalytically.

30. The lacquer according to claim 18 wherein the pre-condensation is carried out at a temperature of between 15° and 50° C. and for a period of time ranging from 1 to 48 hours.

31. The lacquer according to claim 18 wherein the condensation of step (ii) is carried out at a temperature of between 25° and 70° C. and for a period of time ranging from between 2 and 48 hours.

32. The lacquer according to claim 18 wherein the lacquer has an inherent viscosity ranging from between 5 and 1000 $mm^2$/second.

33. The lacquer according to claim 18 wherein the lacquer contains additional additives.

34. The lacquer according to claim 33 wherein the lacquer contains from 1 to 70% of fillers, based on the weight of the lacquer.

35. The lacquer according to claim 18 which is free of solvent.

36. A process for coating a substrate which comprises the steps of applying on a surface of said substrate the lacquer of claim 18 and curing the lacquer.

37. The process according to claim 36 wherein the curing is a thermal curing, carried out at a temperature ranging from between 20° and 200° C., for a period of time ranging from between 10 minutes and 72 hours.

38. The process according to claim 36 wherein the curing is carried out in the presence of hardeners.

39. The process according to claim 36 wherein the curing is photocuring, carried out in the presence of a photoinitiator for a period of time ranging from between 2 seconds and 10 minutes.

40. The process according to claim 36 wherein the curing is a thermal and a photocuring.

41. The process according to claim 36 wherein the curing is comprised of steps of photocuring followed by thermal curing.

42. The process according to claim 36 in which the lacquer is applied through the steps of dip-coating the substrate in the lacquer and spinning-off lacquer from the substrate.

43. The process according to claim 36 wherein the thickness of the coating ranges from between 0.1 and 200 microns.

44. The process according to claim 43 wherein the thickness of the coating ranges from between 1 and 150 microns.

45. A substrate comprising at least one surface having a coating applied thereon, the coating comprising the lacquer of claim 18.

46. The substrate according to claim 45 which is a surface mounted device.

47. The substrate according to claim 45 which is mounted on a printed circuit board.

48. The substrate according to claim 45 which is a thin film capacitor.

49. The substrate according to claim 45 which is a multiple chip module.

50. The substrate according to claim 45 which is an optical component.

51. The substrate according to claim 45 which is a resistor.

52. The substrate according to claim 45 which is an integrated circuit, optionally encapsulated.

53. The substrate according to claim 45 which is a silicon-wafer.

54. The substrate according to claim 48 which is a printed circuit board.

55. The method of coating which comprises coating the laquer of claim 18 onto a thin film capacitor.

* * * * *